United States Patent
Talpallikar et al.

(10) Patent No.: US 10,687,447 B2
(45) Date of Patent: Jun. 16, 2020

(54) METHODS OF APPLYING THERMAL INTERFACE MATERIALS TO BOARD LEVEL SHIELDS

(71) Applicant: Laird Technologies, Inc., Earth City, MO (US)

(72) Inventors: Sri Talpallikar, Hong Kong (HK); Jason L. Strader, Cleveland, OH (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 15/783,259

(22) Filed: Oct. 13, 2017

(65) Prior Publication Data

US 2018/0110158 A1  Apr. 19, 2018

Related U.S. Application Data

(60) Provisional application No. 62/408,417, filed on Oct. 14, 2016.

(51) Int. Cl.
| | |
|---|---|
| B29C 45/14 | (2006.01) |
| H05K 9/00 | (2006.01) |
| H05K 7/20 | (2006.01) |
| F28F 13/00 | (2006.01) |
| F28F 21/02 | (2006.01) |
| F28F 21/08 | (2006.01) |
| H01L 23/552 | (2006.01) |
| H05K 1/02 | (2006.01) |
| H05K 3/34 | (2006.01) |

(52) U.S. Cl.
CPC .......... *H05K 9/009* (2013.01); *B29C 45/14* (2013.01); *F28F 13/003* (2013.01); *F28F 21/02* (2013.01); *F28F 21/084* (2013.01); *F28F 21/085* (2013.01); *H01L 23/552* (2013.01); *H05K 1/0203* (2013.01); *H05K 3/3484* (2013.01); *H05K 7/20418* (2013.01); *H05K 9/0024* (2013.01); *H05K 2201/10371* (2013.01)

(58) Field of Classification Search
None
See application file for complete search history.

(56) References Cited

U.S. PATENT DOCUMENTS

| | | | | |
|---|---|---|---|---|
| 6,016,006 A | * | 1/2000 | Kolman | H01L 21/54 257/712 |
| 6,278,182 B1 | * | 8/2001 | Liu | H01L 21/565 257/667 |

(Continued)

FOREIGN PATENT DOCUMENTS

| | | |
|---|---|---|
| JP | H07106789 A | 4/1995 |
| WO | WO-2015139213 A1 | 9/2015 |

OTHER PUBLICATIONS

Board Level Shielding/LairdTech, http://www.lairdtech.com/product-categories/emi-shields-gaskets/board-level-shielding, Oct. 13, 2016, 8 pages.

(Continued)

*Primary Examiner* — Edmund H Lee
(74) *Attorney, Agent, or Firm* — Harness, Dickey & Pierce, P.L.C.; Anthony G. Fussner

(57) ABSTRACT

Disclosed are exemplary embodiments of board level shields including thermal interface materials. Also disclosed are methods of applying thermal interface materials to board level shields.

10 Claims, 8 Drawing Sheets

Case 2

Case 3

(56) References Cited

U.S. PATENT DOCUMENTS

Figure 1:
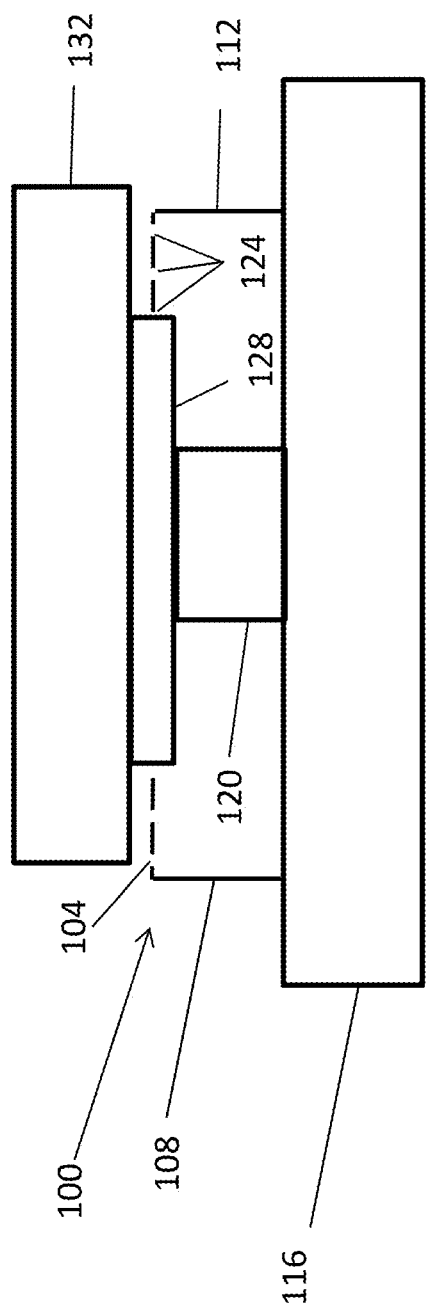

| | | | |
|---|---|---|---|
| 6,617,682 B1* | 9/2003 | Ma | H01L 23/36 |
| | | | 174/253 |
| 6,744,640 B2 | 6/2004 | Reis et al. | |
| 6,891,259 B2* | 5/2005 | Im | H01L 23/16 |
| | | | 257/687 |
| 7,317,618 B2 | 1/2008 | Robinson et al. | |
| 7,463,496 B2 | 12/2008 | Robinson et al. | |
| 8,806,742 B2* | 8/2014 | Cohen | H05K 7/20463 |
| | | | 29/832 |
| 8,900,503 B2* | 12/2014 | Boraas | H01L 23/3737 |
| | | | 264/272.17 |
| 9,222,735 B2 | 12/2015 | Hill et al. | |
| 9,831,035 B2* | 11/2017 | Schmit | H01G 2/08 |
| 2002/0185748 A1* | 12/2002 | Akram | H01L 21/563 |
| | | | 257/778 |
| 2003/0183909 A1* | 10/2003 | Chiu | H01L 23/04 |
| | | | 257/667 |
| 2011/0048795 A1* | 3/2011 | Cohen | H05K 7/20463 |
| | | | 174/547 |
| 2012/0061135 A1 | 3/2012 | Hill et al. | |
| 2013/0074339 A1* | 3/2013 | Boraas | H01L 23/3737 |
| | | | 29/890.03 |
| 2014/0063748 A1 | 3/2014 | Kraft et al. | |
| 2016/0120039 A1 | 4/2016 | Bang et al. | |
| 2016/0126011 A1* | 5/2016 | Schmit | H01G 2/08 |
| | | | 361/274.1 |
| 2018/0228063 A1* | 8/2018 | Dixon | H01L 23/552 |

OTHER PUBLICATIONS www.lairdtech_BoardLevelShielding_page2, Copyright 2016, 2 pages.
Notice of Allowance for U.S. Appl. No. 15/936,045, filed Mar. 26, 2018 which names the same assignee as the instant application, but is not related through a priority claim; dated Oct. 3, 2019, 9 pages.

* cited by examiner

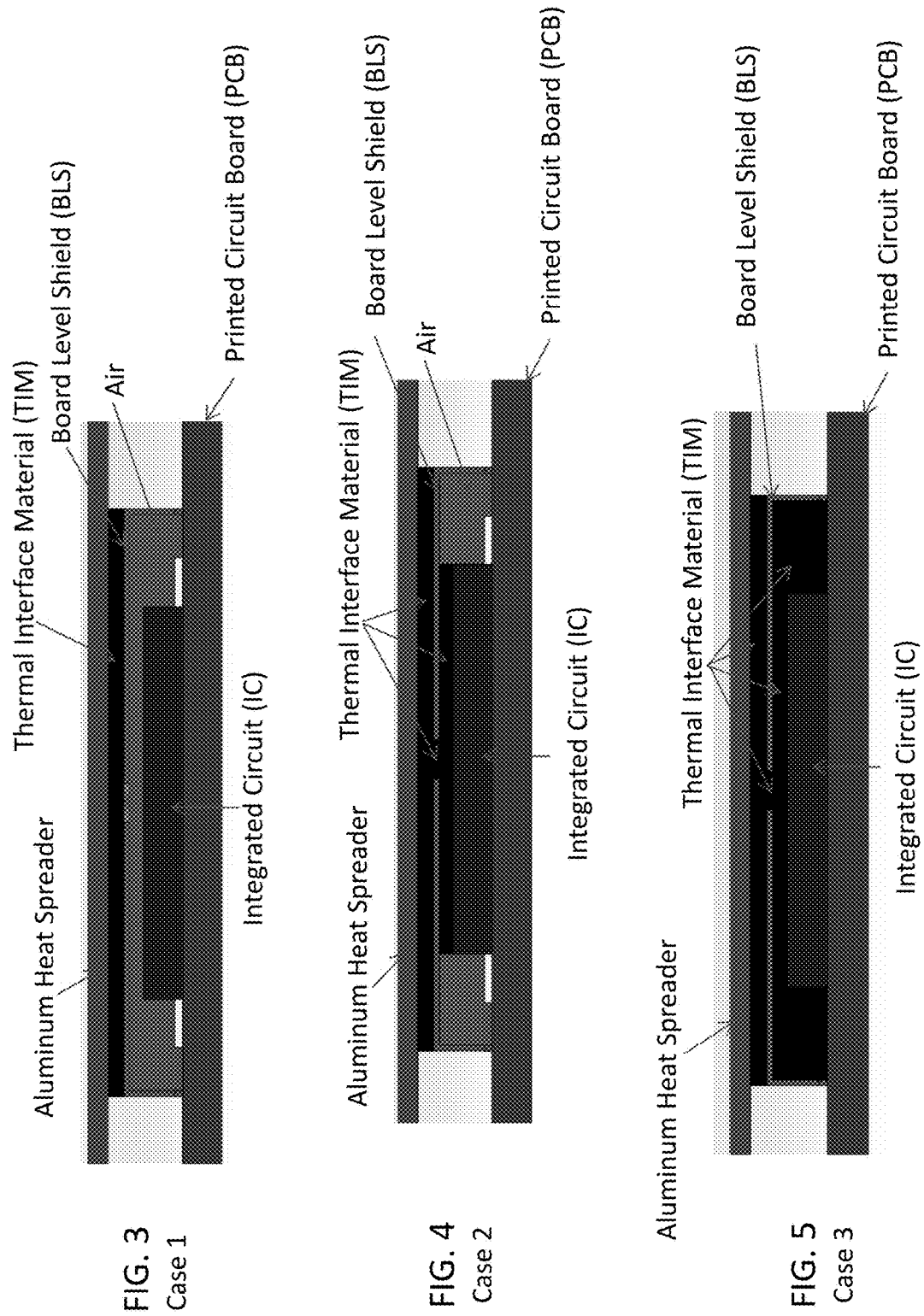

FIG. 6 Case 1
FIG. 7 Case 2
FIG. 8 Case 3

| Component | Tc (W/mK) | Dimensions (mm) |
|---|---|---|
| Heat spreader | 200 | 100 x 100 x 0.5 |
| TIM | 5 | Between BLS and Heat spreader: 0.4<br>Between IC and BLS: 0.35 |
| BLS | 63 | 15 x 15 x 1.5<br>Wall thickness = 0.15<br>Hole diameter = 1 |
| IC | 10 | 10 x 10 x 1 |
| PCB | 22 (in plane)<br>0.3 (out of plane) | 50 x 50 x 1 |

FIG. 9

Case 4: BLS with TIM on both sides

Case 5: BLS with TIM on both sides

Thermal insulance calculation for the section: $\theta_{th} = \frac{L}{Tc} + \theta_c$ Thermal resistance calculation for the section: $R_{th} = \frac{\theta_{th}}{A}$ where $\theta_{th}$ is the total thermal insulance, Tc is the material thermal conductivity, $\theta_c$ is the contact thermal insulance and $R_{th}$ is the total thermal resistance For Tflex Series Thermal Gap Filler (relatively high contact thermal resistance):

| | L (mm) | Tc (W/mK) | $\theta_c$ (K*mm^2/W) | $\theta_{th}$ (K*mm^2/W) | $R_{th}$ (K*/W) |
|---|---|---|---|---|---|
| Case 4 | 0.15 | 65 | 97 | 99 | 99 |
| Case 5 | 0.15 | 5 | 0 | 30 | 30 |

For Tputty Series Thermal Putty and Tpcm Series Thermal Phase Change Material (relatively low contact thermal resistance):

| | L (mm) | Tc (W/mK) | $\theta_c$ (K*mm^2/W) | $\theta_{th}$ (K*mm^2/W) | $R_{th}$ (K*/W) |
|---|---|---|---|---|---|
| Case 4 | 0.15 | 65 | 0.26 | 2.6 | 2.6 |
| Case 5 | 0.15 | 5 | 0 | 30 | 30 |

FIG. 12

For Tflex Series Thermal Gap Filler (relatively high contact thermal resistance):

| | L (mm) | Tc (W/mK) | $\theta_L$ (K*mm^2/W) | $\theta_{th}$ (K*mm^2/W) | $R_{th}$ (K*/W) |
|---|---|---|---|---|---|
| Case 4 | 0.15 | 65 | 97 | 99 | 99 |
| Case 5 | 0.15 | 5 | 0 | 30 | 30 |

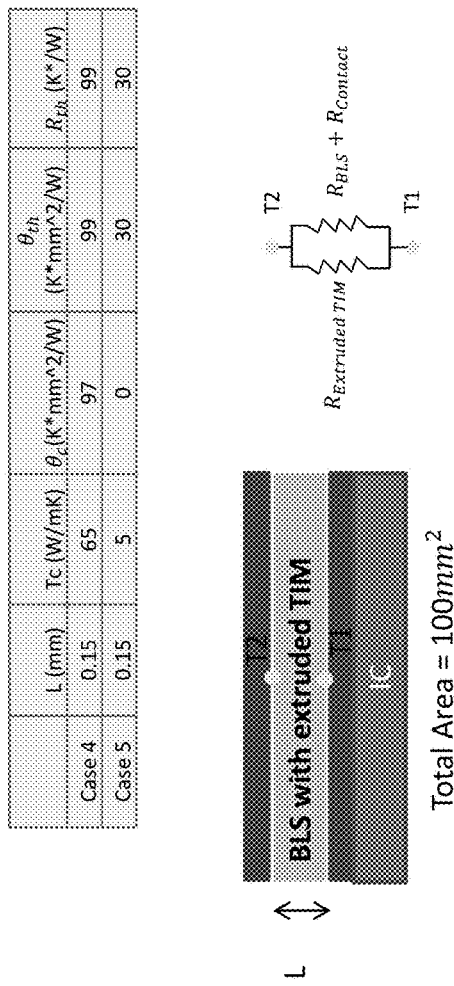

Total Area = $100 mm^2$

Scenario 1:
If there is no extrusion, the total thermal resistance across the BLS is:

$R_{total} = R_{BLS} + R_{Contact} = \frac{\theta_{th}\, for\, case\, 1}{Total\, Area} = \frac{99}{100} = 0.99\ °C/W.$ Assume all the IC power (3W) goes through the BLS, then T1-T2 = 0.99*3 = 2.97°C

Scenario 2:
If there is x% area extruded with TIM, the total thermal resistance across the BLS is:

$R_{total} = \cfrac{1}{\cfrac{1}{R_{Extruded\, TIM}} + \cfrac{1}{R_{BLS}+R_{Contact}}} = \frac{99}{230x+100}\ °C/W.$ Assume all the IC power (3W) goes through the BLS, then T1-T2 = $\frac{99}{230x+100}*3 = \frac{297}{230x+100}\ °C$ For at least 1°C of improvement: $\frac{297}{230x+100} \leq 1.97$, solve for $x$, $x \geq 22\%$

FIG. 13

METHODS OF APPLYING THERMAL INTERFACE MATERIALS TO BOARD LEVEL SHIELDS

CROSS-REFERENCE TO RELATED APPLICATION

This application claims the benefit of and priority to U.S. Provisional Patent Application No. 62/408,417 filed Oct. 14, 2016. The entire disclosure of the above application is incorporated herein by reference.

FIELD

The present disclosure relates to board level shields including thermal interface materials and methods of applying thermal interface materials to board level shields.

BACKGROUND

This section provides background information related to the present disclosure which is not necessarily prior art.

Electrical components, such as semiconductors, integrated circuit packages, transistors, etc., typically have pre-designed temperatures at which the electrical components optimally operate. Ideally, the pre-designed temperatures approximate the temperature of the surrounding air. But the operation of electrical components generates heat. If the heat is not removed, the electrical components may then operate at temperatures significantly higher than their normal or desirable operating temperature. Such excessive temperatures may adversely affect the operating characteristics of the electrical components and the operation of the associated device.

To avoid or at least reduce the adverse operating characteristics from the heat generation, the heat should be removed, for example, by conducting the heat from the operating electrical component to a heat sink. The heat sink may then be cooled by conventional convection and/or radiation techniques. During conduction, the heat may pass from the operating electrical component to the heat sink either by direct surface contact between the electrical component and heat sink and/or by contact of the electrical component and heat sink surfaces through an intermediate medium or thermal interface material (TIM). The thermal interface material may be used to fill the gap between thermal transfer surfaces, in order to increase thermal transfer efficiency as compared to having the gap filled with air, which is a relatively poor thermal conductor.

In addition, a common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

FIG. 1 illustrates a board level shield (BLS) according to an exemplary embodiment in which a thermal interface material (TIM) forms contiguous, homogeneous, continuous, or integral TIM portions or layers along opposite first and second (or upper and lower) sides of a BLS cover (broadly, a portion of a BLS) and within one or more holes in the BLS cover. The TIM within the one or more holes may be contiguous with, in contact with, and provide a direct thermal connection between the first and second (or upper and lower) TIM portions or layers respectively disposed along the first and second (or upper and lower) sides of the BLS cover.

Figure 2:
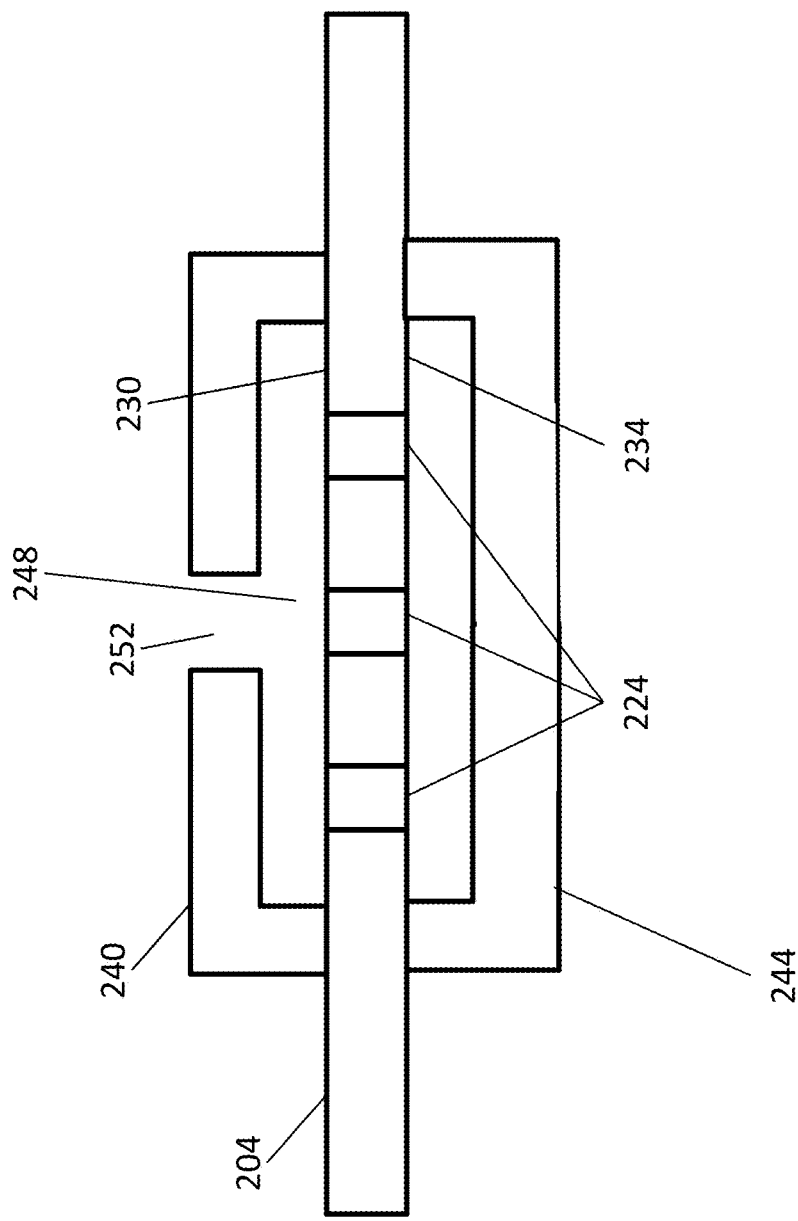

FIG. 2 illustrates a cover of a board level shield (BLS) positioned in between first and second (or upper and lower) dies or portions of a mold according to an exemplary embodiment. A thermal interface material (TIM) may be extruded or otherwise dispensed via an inlet (broadly, an opening) into a cavity defined between the two dies or mold portions such that the TIM forms contiguous, homogeneous, continuous, or integral TIM portions or layers along opposite first and second (or upper and lower) sides of the BLS cover (broadly, a portion of a BLS) and within one or more holes in the BLS cover. The TIM within the one or more holes may be contiguous with, in contact with, and provide a direct thermal connection between the first and second (or upper and lower) TIM portions or layers respectively disposed along the first and second (or upper and lower) sides of the BLS cover.

FIG. 3 illustrates a first conventional assembly (Case 1 model) in which a thermal interface material (TIM) is along only an upper side of a cover of a board level shield (BLS). The TIM is positioned between the upper side of the BLS cover and an aluminum heat spreader. Also shown are an integrated circuit (IC) (broadly, a heat source) on a printed circuit board (PCB) (broadly, a substrate). Air fills the interior space or cavity defined under the BLS.

FIG. 4 illustrates a second assembly (Case 2 model) according to an exemplary embodiment in which a thermal interface material (TIM) forms contiguous, homogeneous, continuous, or integral TIM portions or layers along opposite first and second (or upper and lower) sides of a BLS cover (broadly, a portion of a BLS). A portion of the TIM is also within an opening in the BLS cover, which TIM portion integrally connects and provides a direct thermal connection between the first and second (or upper and lower) TIM portions or layers respectively disposed along the first and second (or upper and lower) sides of the BLS cover. Also shown are an integrated circuit (IC) (broadly, a heat source) on a printed circuit board (PCB) (broadly, a substrate). In this exemplary embodiment, air only partially fills the interior space or cavity defined under the BLS. More specifically, air fills the space or gap between the PCB and the BLS, but the lower portion of the TIM fills the space or gap between the upper surface of the IC and the lower side of the BLS cover.

FIG. 5 illustrates a third assembly (Case 3 model) according to an exemplary embodiment in which a thermal interface material (TIM) forms contiguous, homogeneous, continuous, or integral TIM portions or layers along opposite first and second (or upper and lower) sides of a BLS cover (broadly, a portion of a BLS). A portion of the TIM is also within an opening in the BLS cover, which TIM portion integrally connects and provides a direct thermal connection between the first and second (or upper and lower) TIM portions or layers respectively disposed along the first and second (or upper and lower) sides of the BLS cover. Also shown are an integrated circuit (IC) (broadly, a heat source) on a printed circuit board (PCB) (broadly, a substrate). In this exemplary embodiment, the TIM entirely fills the interior space or cavity defined under the BLS.

FIGS. 6 through 8 include thermal modeling simulation results for the assemblies (Case 1, 2, and 3 models) respectively shown in FIGS. 3 through 5.

FIG. 9 includes a table with example thermal conductivities in Watts per meter-Kelvin (W/mK) and example dimensions in millimeters (mm) for the heat spreader, TIM, BLS, IC and PCB of the assemblies shown in FIGS. 3 through 5, which were used during the thermal modeling simulations to produce the results shown in FIGS. 6 through 8.

Figure 10:
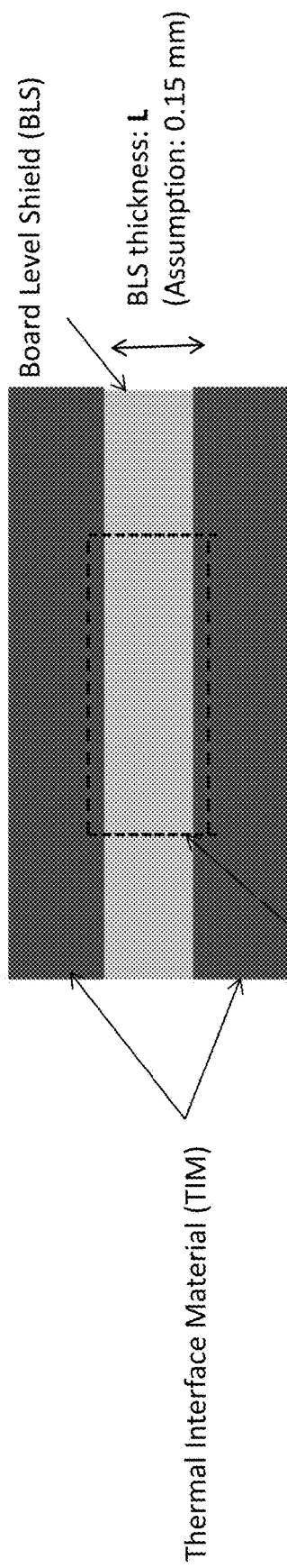

FIG. 10 illustrates a fourth conventional assembly (Case 4 model) in which a thermal interface material (TIM) is along the both of the upper and lower sides of a cover of a board level shield (BLS).

Figure 11:
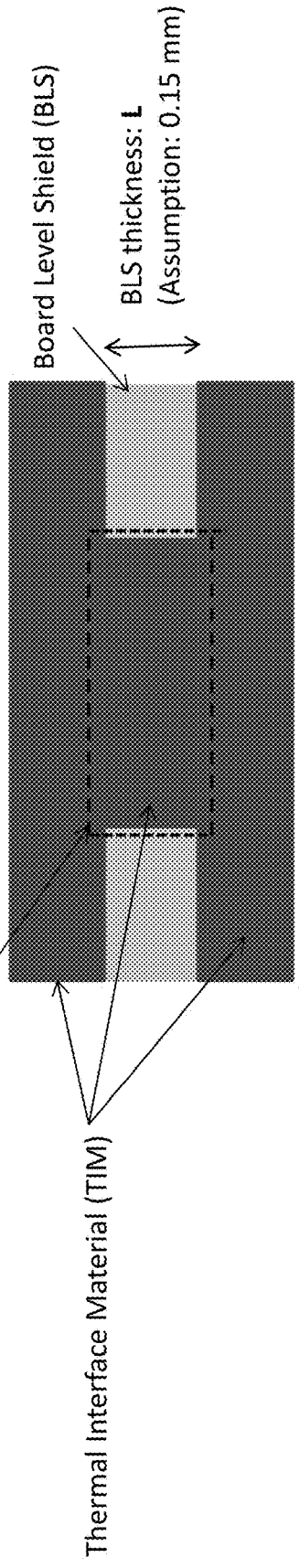

FIG. 11 illustrates a fifth assembly (Case 5 model) according to an exemplary embodiment in which a thermal interface material (TIM) forms contiguous, homogeneous, continuous, or integral TIM portions or layers along opposite first and second (or upper and lower) sides of a BLS cover (broadly, a portion of a BLS). A portion of the TIM is also within (e.g., extruded within, etc.) an opening in the BLS cover, which TIM portion integrally connects and provides a direct thermal connection between the first and second (or upper and lower) TIM portions or layers respectively disposed along the first and second (or upper and lower) sides of the BLS cover.

FIG. 12 includes tables with total thermal resistance (Rth) and total thermal insulance ($\theta_{th}$) results for the assemblies (Case 4 and 5 models) respectively shown in FIGS. 10 and 11. The table also includes the example lengths (L), example thermal conductivities (Tc), and example contact thermal insulance ($\theta_c$) used to calculate thermal insulance using the equation, which is also shown in FIG. 12.

FIG. 13 demonstrates that about 22% of the surface area must become TIM without the BLS interface in order to achieve an improvement of 1° C. for this particular example. Accordingly, at least about 10% or greater area needs to have holes with the TIM therein (e.g., TIM directly cured to itself, etc.) to achieve a target minimum of about 0.5° C. improvement.

DETAILED DESCRIPTION

Example embodiments will now be described more fully with reference to the accompanying drawings.

Increasing device functionality is driving higher and faster computing power, which, in turn, is leading to the use of higher performance chips and integrated circuits. These integrated circuits generate increasing amounts of heat that needs to be transferred out of the integrated circuits and devices to function efficiently.

This heat problem is exacerbated when electronic density in the device is increased. In cases where an integrated circuit (IC) is shielded for EMI using a board level shield (BLS) on a printed circuit board (PCB), conventional solutions rely upon two separate and distinct first and second pieces of thermal interface materials. The first thermal interface material (TIM1) is positioned inside or underneath the BLS along a lower inner side of the BLS cover. The second thermal interface material (TIM2) is positioned outside or on top of the BLS along an upper outer side of the BLS cover. In use, the BLS may be positioned such that the first thermal interface material contacts the integrated circuit underneath the BLS while the second thermal interface material contact a heat sink (or other heat removal/dissipation structure) above the BLS. In the thermally-conductive heat path from the integrated circuit to the heat sink, the BLS cover is an interface between or with each of the two separate, distinct, and spaced-apart pieces of thermal interface material. This may cause the overall heat transfer efficiency to be relatively low due to the existence of multiple interfaces including the first interface between the BLS cover and the TIM1 and the second interface between BLS cover and the TIM2.

Accordingly, disclosed herein are thermal transfer/management and EMI shielding/mitigation solutions that allow for improved heat transfer efficiency without compromising on the EMI shielding. Exemplary embodiments are able to improve heat transfer efficiency by reducing the number of interfaces as heat transfer efficiency is indirectly proportional to the number of interfaces between the heat source and heat sink. The exemplary integrated EMI shielding/thermal transfer systems may be used to improve heat transfer from an integrated circuit on a printed circuit board (or other heat source) covered with a BLS for EMI shielding to a heat sink or other heat removal/dissipation structure.

In exemplary embodiments, a thermal interface material (TIM) is dispensed (e.g., via a nozzle, etc.), extruded (e.g., via extrusion, etc.), molded (e.g., insert molded, etc.), pushed, forced, or otherwise applied into and through one or more openings (e.g., a single large hole, multiple holes, etc.) in a portion of a single piece or multi-piece BLS. For example, the one or more openings may extend through an upper surface, cover, lid, top, or other portion of a single piece or multi-piece BLS, etc. After being applied (e.g., via extrusion, dispensing via a nozzle, after being added into a cavity defined generally by and/or between dies or portions of a mold, via insert molding, etc.), the thermal interface material may form contiguous, homogeneous, continuous, or integral TIM portions or layers along opposite first and second (or upper and lower) sides of a portion of the BLS (e.g., BLS cover, etc.) and within the one or more openings. In exemplary embodiments in which the TIM is extruded into the and through one or more openings in the BLS cover or other BLS portion, thickness of the TIM material may be controlled in the extrusion process using appropriately designed tools and fixtures.

By way of example, a thermal interface material (TIM) may be dispensed (e.g., via a nozzle, etc.), extruded (e.g., via extrusion, etc.), pushed, forced, or otherwise applied into and through one or more openings (e.g., a single large hole, multiple holes, etc.) in a single piece or multi-piece BLS after the BLS has already been attached (e.g., soldered, etc.) to a printed circuit board, etc. In exemplary embodiments, a BLS having at least one opening may be pre-applied or installed to a board. A nozzle may be relatively positioned and aligned with the at least one opening (e.g., inserted at least partially into the at least one opening, etc.) of the BLS after the BLS is installed to the board (e.g., after solder reflow, etc.). The nozzle may then dispense a thermal interface material into the interior space or cavity underneath the BLS that is defined generally between the board (or components thereon) and inner surfaces of the BLS (e.g., inner surfaces of the BLS frame and cover, etc.). The nozzle may continue to dispense the TIM into the interior space or cavity until the interior space or cavity is at least partially or entirely filled with the TIM. Simultaneously, directly after, or shortly after filling the interior space or cavity with TIM via the nozzle (depending on the jig design), the top or other exterior portion of the BLS may be provided with a TIM material (e.g., the same TIM applied using the same nozzle, different TIM, etc.) to a specified or predetermined thickness. The BLS may include one or more holes or openings that allow the TIM to form a continuous heat path from one side of the BLS through the hole(s) to the opposite side of the BLS to thereby reduce contact resistance and improve adhesion of the TIM to the BLS.

In exemplary embodiments, a BLS cover or portion having at least one opening may be placed in between first and second (e.g., upper and lower, left and right, etc.) dies or portions of mold and within a cavity defined by the first and second dies or mold portions (e.g., as shown in FIG. 2, etc.). Thermal interface material may then be dispensed (e.g., extruded, etc.) into the cavity via one or more inlets or openings into the cavity. An inlet (broadly, an opening) may be defined by either the first die or mold portion or the second die or mold portion. Or, an inlet may be defined generally by or between both of the first and second dies or mold portions. As yet another example, a first or upper inlet may be defined by a first or upper die or mold portion, and a second or lower inlet may be defined by a second or lower die or mold portion. The TIM may be continued to be dispensed into the cavity until the TIM is within (e.g., entirely fills, etc.) the opening(s) in the BLS cover or portion and/or the TIM forms a layer along either or both of the upper and lower sides of the BLS cover or portion and/or the TIM.

The TIM within the one or more openings of the BLS cover or other BLS portion may be contiguous and in contact with the first and second (or upper and lower) TIM portions or layers, which are respectively disposed along opposite first and second (or upper and lower) sides of the BLS cover or other BLS portion. The TIM within the one or openings may provide a direct thermal connection or interface between the first and second (or upper and lower) TIM portions or layers.

The direct thermal connection or interface provided by the TIM within the one or openings allow for the elimination of the two interfaces otherwise separately provided by the BLS (e.g., BLS cover or other BLS portion, etc.) to the first and second (or upper and lower) TIM portions or layers. Stated differently, a thermally-conductive heat path is cooperatively defined by the contiguous, homogeneous, continuous, or integral TIM portions or layers along both sides of the BLS cover and within the one or more openings. Accordingly, heat may be transferred from a heat source to the first or lower TIM portion or layer, through the TIM within the one or more openings, and to the second or upper TIM portion or layer. Although some heat may also be transferred from the first or lower TIM portion or layer through the BLS cover (or other BLS portion) to the second or upper TIM portion or layer, the direct thermal connection or interface provided by the TIM within the one or openings improves heat transfer efficiency as the thermally-conductive heat path from the first or lower TIM portion or layer to the second or upper TIM portion or layer does not require or rely upon the BLS to provide two interfaces between the first or lower TIM portion to the second or upper TIM portion. Accordingly, heat transfer efficiency may be improved by the elimination of the two interfaces that would otherwise be provided by the BLS to the first and second (or upper and lower) TIM portions.

With reference to the figures, FIG. 1 illustrates an exemplary embodiment of a board level shield (BLS) 100 embodying one or more aspects of the present disclosure. In this exemplary embodiment, the BLS 100 includes a cover or lid 104 and a frame or fence 108. The frame 108 includes one or more sidewalls 112 configured for installation (e.g., soldering, etc.) to a printed circuit board (PCB) 116 (broadly, a substrate) generally about one or more components or heat sources 120 (e.g., an integrated circuit, etc.) on the PCB 116.

With continued reference to FIG. 1, the cover 104 includes openings 124 (e.g., holes, apertures, etc.). A thermal interface material (TIM) 128 forms contiguous, homogeneous, continuous, or integral TIM portions or layers along both sides of the cover 104 and within some of the cover's openings 124. In this example, the TIM 128 is shown disposed within and covering less than all of the cover's openings 124. The openings 124 that are not covered by the TIM 128 may facilitate solder reflow heating interiorly of the cover 104, may allow flux gas to escape during solder reflow, may help with cooling of the heat source 120 by allowing heat to pass through the uncovered openings 124, and/or may permit visual inspection of the heat source 120 or other components beneath the cover 104. The openings 124 that are not covered with TIM 128 may be sufficiently small to inhibit passage of interfering EMI. In other exemplary embodiments, the TIM 128 may be disposed within and/or covering all of the openings 124 of the cover 104. For example, the TIM 128 may be configured to provide EMI shielding in which case it might be advantageous for the TIM 128 to be disposed within and/or to cover all of the openings 124 in the cover 104 to thereby help prevent leakage of EMI through the openings 124. The particular number, size, shape, orientation, etc. of the openings 124 may vary depending, for example, on the particular application (e.g., sensitivity of the electronics where more sensitive circuitry may necessitate the use of smaller diameter holes, etc.).

The TIM 128 may be dispensed (e.g., via a nozzle, etc.), extruded (e.g., via extrusion, etc.), molded (e.g., via insert molding, etc.), pushed, forced, or otherwise applied into and through one or more of the openings 124 of the cover 104. For example, the TIM 128 may comprise a thermal gap filler, thermal putty, cure-in-place thermal interface material, etc. that is extruded from one or both sides of the BLS cover 104 such that the TIM 128 is along both sides of the BLS cover 104 and within the openings 124. The TIM 128 may form contiguous, homogeneous, continuous, or integral layers or portions along the upper and lower or opposite sides of the BLS cover 104 and within the cover's openings 124. The thickness of the TIM layers or portions along the upper and lower sides of the BLS cover 104 may be controlled in the extrusion process using appropriately designed tools and fixtures. Alternatively, the TIM 128 may instead be applied to the BLS cover 104 by insert molding. For example, the BLS cover 104 may be positioned or inserted into a mold, and then the TIM 128 may be injected or otherwise added to the mold.

As yet another example, the TIM 128 may be dispensed via a nozzle (broadly, a dispensing device) after the BLS 100 has been already been installed (e.g., soldered, attached, after solder reflow, etc.) to the PCB 116. In this example, the nozzle may be relatively positioned and aligned with at least one opening 124. For example, the nozzle may be directly aligned with and/or inserted at least partially into the at least one opening 124. The nozzle may then dispense a thermal interface material through the at least one opening 124 into the interior space or cavity underneath the BLS 100 that is defined generally between the PCB 116 (and/or heat source 120 thereon) and inner surfaces of the BLS 100 (e.g., inner surfaces of the BLS frame 108 and cover 104, etc.). The nozzle may continue to dispense the TIM 128 through the at least one opening 124 into the interior space or cavity until the interior space or cavity is at least partially or entirely filled with the TIM 128. Simultaneously, directly after, or shortly after filling the interior space or cavity with TIM 128 via the nozzle (depending on the jig design), the top or other exterior portion of the BLS cover 104 may be provided with the same TIM material 128 to a specified or predetermined thickness. The TIM 128 may then form a continuous heat path from one side of the BLS 100 through the openings 124 to the opposite side of the BLS 100 to thereby reduce contact resistance and improve adhesion of the TIM 128 to the BLS 100.

The TIM layers or portions along the first and second (or upper and lower) sides of the BLS cover 104 and within the cover's openings 124 cooperatively define a thermally-conductive heat path that doesn't require an interface(s) provided by the BLS cover 104. Instead, the TIM 128 within the openings 124 provides a direct thermal connection or interface between the upper and lower TIM layers or portions that are respectively along the upper and lower sides of the BLS cover 104. This direct thermal connection or interface provided by the TIM 128 within the openings 128 improves heat transfer efficiency by eliminating the requirement or use of two interfaces that would otherwise be provided by a conventional BLS cover and first and second thermal interface materials along the opposite lower and upper sides of the cover.

As shown in FIG. 1, the BLS 100 may be installed to the PCB 116 such that the heat source 120 is underneath the BLS 100 within an interior cooperatively defined by the frame 108, cover 104, TIM 128, and PCB 116. The TIM 128 is shown in contact (e.g., compressed against, etc.) with both the heat source 120 and the heat sink 132. Heat may thus be transferred from the heat source 120 to the heat sink 132 by via the thermally-conductive heat path defined by and through the TIM 128. More specifically, heat may be transferred from the heat source 120 to the lower TIM portion or layer along lower side of the cover 104. Heat may then be transferred from the lower TIM portion or layer through the TIM within the openings 124 to the upper TIM portion or layer along the upper side of the cover 104. From the upper TIM portion or layer, heat may then be transferred to the heat sink 132. Although some heat may also be transferred from the lower TIM portion or layer through the BLS cover 104 to the upper TIM portion or layer, the direct thermal connection or interface provided by the TIM within the openings 124 improves heat transfer efficiency.

FIG. 2 illustrates a cover 204 (broadly, a portion) of a board level shield (BLS) positioned between first and second dies or mold portions 240, 244 according to an exemplary embodiment. In this example, the first and second dies or mold portions 240, 244 comprise upper and lower dies or mold portions 240, 244, respectively, that may open and close vertically relatively to each other. Alternatively, the first and second dies or mold portions 240, 244 may comprise left and right dies or mold portions arranged to open and close laterally or horizontally relative to each other.

As shown in FIG. 2, the cover 204 includes openings 224 (e.g., holes, apertures, etc.). The cover 204 is positioned generally between the first and second dies or mold portions 240, 244 within a cavity 248 cooperatively defined by and/or between the first and second dies or mold portions 240, 244. In this example, an inlet 252 (broadly, opening) is defined by the first mold portion or die 240.

A thermal interface material (TIM) may be extruded, injected, or otherwise fed or dispensed (e.g., via a nozzle, etc.) through the inlet 252 into the cavity 248. The TIM may be dispensed into the cavity 248 through the inlet 252 such that the TIM will be disposed generally around the cover 204. The TIM may form a single piece, monolithic TIM with portions that extend and/or are disposed along both the first and second sides (or upper and lower sides in this example) 230, 234 of the BLS cover 204 and that are within the openings 224 in the BLS cover 204. Portions of the TIM within the one or more openings 224 may be contiguous with, in contact with, and provide a direct thermal connection between first and second (or upper and lower) TIM portions or layers along the respective first and second sides 230, 234 of the BLS cover 204. The BLS cover 204 may be disposed between first and second (or upper and lower) contiguous, homogeneous, continuous, or integral TIM portions or layers, which are along the opposite first and second sides 230, 234 of the BLS cover 204.

In the illustrated exemplary embodiment of FIG. 2, the inlet 252 is defined by the first or upper die or mold portion 240. In another exemplary embodiment, an inlet may be defined by the second or lower die or mold portion 244. In a further exemplary embodiment, an inlet may be defined generally by or between both of the first and second (upper and lower) dies or mold portions 240, 244. As yet another example, a first or upper inlet may be defined by the first or upper die or mold portion 240, and a second or lower inlet may be defined by the second or lower die or mold portion 244. In this latter example, TIM may be dispensed through the first or upper inlet into the cavity 248 and along the first or upper side 230 of the BLS cover 204, and TIM may be dispensed through the second or lower inlet into the cavity 248 and along the second or lower side 234 of the BLS cover 204. In exemplary embodiments, the TIM may be dispensed at least until after the TIM has flowed, extruded, been pressed, forced, or otherwise moved into and is thus within (e.g., entirely fills, etc.) the opening(s) in the BLS cover 204 and/or the TIM forms a layer along either or both of the upper and lower sides of the BLS cover 204.

FIGS. 3 through 5 illustrate first, second and third assemblies or models (Case 1, 2, and 3) that were used during thermal modeling simulations to produce the results shown in FIGS. 6 through 8. More specifically, FIG. 3 illustrates a first conventional assembly or model (Case 1) in which a thermal interface material (TIM) is only along an upper side of a cover of a board level shield (BLS). The TIM is positioned between the upper surface of the BLS cover and an aluminum heat spreader. Also shown are an integrated circuit (IC) (broadly, a heat source) on a printed circuit board (PCB) (broadly, a substrate). Air fills the interior space or cavity defined under the BLS.

FIG. 4 illustrates a second assembly or model (Case 2) according to an exemplary embodiment in which a thermal interface material (TIM) forms contiguous, homogeneous, continuous, or integral TIM portions or layers along opposite first and second (or upper and lower) sides of a BLS cover (broadly, a portion of a BLS). A portion of the TIM is also within an opening in the BLS cover, which TIM portion integrally connects and provides a direct thermal connection between the first and second (or upper and lower) TIM portions or layers respectively disposed along the first and second (or upper and lower) sides of the BLS cover. Also shown are an integrated circuit (IC) (broadly, a heat source) on a printed circuit board (PCB) (broadly, a substrate). In this exemplary embodiment, air only partially fills the interior space or cavity defined under the BLS. More specifically, air fills the space or gap between the PCB and the BLS, but the lower portion of the TIM fills the space or gap between the upper surface of the IC and the lower side of the BLS cover.

FIG. 5 illustrates a third assembly or model (Case 3) according to an exemplary embodiment in which a thermal interface material (TIM) forms contiguous, homogeneous, continuous, or integral TIM portions or layers along opposite first and second (or upper and lower) sides of a BLS cover (broadly, a portion of a BLS). A portion of the TIM is also within an opening in the BLS cover, which TIM portion integrally connects and provides a direct thermal connection between the first and second (or upper and lower) TIM portions or layers respectively disposed along the first and second (or upper and lower) sides of the BLS cover. Also shown are an integrated circuit (IC) (broadly, a heat source) on a printed circuit board (PCB) (broadly, a substrate). In this exemplary embodiment, the TIM entirely fills the interior space or cavity defined under the BLS.

FIGS. 6 through 8 include thermal modeling simulation results for the assemblies or models (Case 1, 2, and 3) respectively shown in FIGS. 3 through 5. As shown, the assemblies or models (Case 2 and 3) according to exemplary embodiments had significantly better thermal performance in terms of maximum temperature (Tmax of 58.7° C. for Case 2 and Tmax of 58° C. for Case 3) as compared to the convention assembly or model of Case 1, which had a much high maximum temperature Tmax of 105° C. These results are provided only for purposes of illustration and not for purposes of limitation as other exemplary embodiments may be configured differently such that there is a higher or lower maximum temperature.

FIG. 9 includes a table with example thermal conductivities in Watts per meter-Kelvin (W/mK) and example dimensions in millimeters (mm) for the heat spreader, TIM, BLS, IC and PCB shown in FIGS. 3 through 5, which were used during the thermal modeling simulations to produce the results shown in FIGS. 6 through 8. As shown in the table, the heat spreader had a thermal conductivity of 200 W/mK, a length of 100 mm, a width of 100 mm, and a thickness of 0.5 mm. The TIM had a thermal conductivity of 5 W/mK, a thickness of 0.4 mm between the BLS and heat spreader and a thickness of 0.35 mm between the IC and the BLS. The BLS had a thermal conductivity of 63 W/mK, a length of 15 mm, a width of 15 mm, a height of 1.5 mm, a wall thickness of 1 mm, and an opening or hole diameter of 1 mm. The IC had a thermal conductivity of 10 W/mK, a length of 10 mm, a width of 10 mm, a height of 1 mm. The PCB had a thermal conductivity of 22 W/mK in plane and 0.3 W/mK out of plane, a length of 50 mm, a width of 50 mm, a height of 1 mm. The thermal modeling simulations included assumptions of nature convection, ambient temperature $T_{amb}$ of 20° C. and IC power of 3 watts. These thermal conductivities, dimensions, and assumptions are provided only for purposes of illustration and not for purposes of limitation as other exemplary embodiments may be configured differently, such as with one or more components having a higher or lower thermal conductivity and/or different dimensions than that shown in the table and/or made from different materials (e.g., a heat spreader made of other materials besides aluminum, etc.), etc.

FIG. 10 illustrates a fourth conventional assembly (Case 4 model) in which a thermal interface material (TIM) is along the both of the upper and lower sides of a cover of a board level shield (BLS).

FIG. 11 illustrates a fifth assembly (Case 5 model) according to an exemplary embodiment in which a thermal interface material (TIM) forms contiguous, homogeneous, continuous, or integral TIM portions or layers along opposite first and second (or upper and lower) sides of a BLS cover (broadly, a portion of a BLS). A portion of the TIM is also within (e.g., extruded within, etc.) an opening in the BLS cover, which TIM portion integrally connects and provides a direct thermal connection between the first and second (or upper and lower) TIM portions or layers respectively disposed along the first and second (or upper and lower) sides of the BLS cover.

The sections within the boxes defined by the dashed lines in FIGS. 10 and 11 are where the thermal performance is different for the fourth and fifth assemblies shown in FIGS. 10 and 11.

FIG. 12 includes tables with total thermal resistance (Rth) and total thermal insulance ($\theta_{th}$) results for the assemblies (Case 4 and 5 models) respectively shown in FIGS. 10 and 11. The table also includes the example lengths (L), example thermal conductivities (Tc), and example contact thermal insulance ($\theta_c$) used to calculate the total thermal insulance and total thermal resistance using the equations, which are also shown in FIG. 12 and set forth below.

Thermal insulance calculation for the section:

$$\theta_{th} = \frac{L}{Tc} + \theta_c$$

Thermal resistance calculation for the section:

$$R_{th} = \frac{\theta_{th}}{A}$$

where $\theta_{th}$ is the total thermal insulance, Tc is the material thermal conductivity, $\theta_c$ is the contact thermal insulance and $R_{th}$ is the total thermal resistance.

As shown in the tables, the length (L) was 0.15 mm for all cases, the thermal conductivities (Tc) were 65 W/mK and 5 W/mK, and contact thermal insulance ($\theta_r$) was 97 K*mm$^2$/W for the thermal gap filler and 0.26 K*mm$^2$/W for the thermal putty or thermal phase change material.

For TIMs with high thermal contact resistance/insulance (e.g., a thermal gap filler having a thermal contact insulance of 97 K*mm$^2$/W, etc.), the extruded TIM concept (Case 5) has better thermal performance due to the elimination of contact resistance for the hole area. For TIMs with low thermal contact resistance (e.g., a thermal putty having a thermal contact insulance of 0.26 K*mm$^2$/W, etc.), the extruded TIM concept has worse thermal performance due to the lower thermal conductivity of the TIM compared with the metal BLS.

FIG. 13 demonstrates that at least about 22% of the surface area must become TIM without the BLS interface in order to achieve an improvement of 1° C. for this particular example with the length, thermal conductivity, and thermal contact insulance shown in the table. Accordingly, at least about 10% or greater area needs to have holes with the TIM therein (e.g., TIM directly cured to itself, etc.) to achieve a target minimum of about 0.5° C. improvement for this particular example.

In the first scenario of FIG. 13 in which there is no extrusion of the TIM within a hole of the BLS, the total thermal resistance across the BLS is:

$$R_{total} = R_{BLS} + R_{Contact} = \frac{\theta_{th} \text{ for case 1}}{\text{Total Area}} = \frac{99}{100} = 0.99° \text{ C./W}.$$

If it is assumed that all the IC power (3 W) goes through the BLS, then T1−T2=0.99*3=2.97° C. As shown in FIG. 13, T1 represents the temperature of the TIM portion below the BLS. T2 represents the temperature of the TIM portion above the BLS.

In the second scenario of FIG. 13 in which there is x % area extruded with TIM, the total thermal resistance across the BLS is:

$$R_{total} = \frac{1}{\frac{1}{R_{Extruded\ TIM}} + \frac{1}{R_{BLS} + R_{Contact}}} = \frac{99}{230x + 100}° \text{ C./W}.$$

If it is assumed that all the IC power (3 W) goes through the BLS, then:

$$T1 - T2 = \frac{99}{230x + 100} * 3 = \frac{297}{230x + 100}° \text{ C}.$$

For at least 1° C. of improvement:

$$\frac{297}{230x + 100} \leq 1.97,$$

solve for x, x≥22%

Accordingly, this demonstrates that at least about 22% of the surface area must become TIM without the BLS interface in order to achieve an improvement of 1° C. for this particular example with the length, thermal conductivity, and thermal contact insulance shown in the table. Accordingly, at least about 10% or greater area needs to have holes with the TIM therein (e.g., TIM directly cured to itself, etc.) to achieve a target minimum of about 0.5° C. improvement for this particular example.

In an exemplary embodiment, a method is disclosed that comprises applying a thermal interface material to a board level shield, such that first and second (or upper and lower) homogeneous portions of the thermal interface material are respectively along opposite or opposing first and second (or upper and lower) sides of a portion of the board level shield (e.g., a BLS cover, etc.), and one or more homogeneous portions of the thermal interface material are within one or more openings in the portion of the board level shield that extend through the portion of the board level shield from the first or lower side to the second or upper side. The one or more homogeneous portions of the thermal interface material within the one or more openings are contiguous with and provide a direct thermal connection or interface between the first and second (or upper and lower) homogeneous portions of the thermal interface material such that a thermally-conductive heat path is cooperatively defined by the first or lower homogeneous portion of the thermal interface material along the first or lower side of the portion of the board level shield, the one or more homogeneous portions of the thermal interface material within the one or more openings, and the second or upper homogeneous portion of the thermal interface material along the second or upper side of the portion of the board level shield.

The thermal interface material may be applied to the board level shield by dispensing the thermal interface material through at least one opening of the one or more openings in the portion of the board level shield into an interior space defined by the board level shield. The method may include dispensing the thermal interface material through the at least one opening via a nozzle to thereby at least partially fill the interior space with the dispensed thermal interface material. The method may further include positioning a nozzle relative to (e.g., in alignment with, at least partially into, etc.) the at least one opening in the board level shield.

The method may further include installing the board level shield to a substrate, and after installing the board level shield to the substrate, dispensing the thermal interface material through the at least one opening into the interior space between the substrate and the board level shield to thereby at least partially fill the interior space with the thermal interface material.

The method may include continuing to dispense the thermal interface material through the at least opening into the interior space until the interior space is entirely filled with the dispensed thermal interface material.

The thermal interface material may be applied to the board level shield by extruding the thermal interface material from the first or lower side and/or the second or upper side of the portion of the board level shield such that the thermal interface material extrudes into the one or more openings.

The thermal interface material may be applied to the board level shield by positioning the portion of the board level shield within a cavity and dispensing the thermal interface material into the cavity. The cavity may be defined by first and second dies or mold portions, and dispensing the thermal interface material into the cavity comprises dispensing the thermal interface material into the cavity through at least one inlet defined by the first die or mold portion and/or the second die or mold portion.

The method may include integrally forming all of the first and second (or upper and lower) homogeneous portions of the thermal interface and the one or more homogeneous portions of the thermal interface material within the one or more openings from the same thermal interface material such that the first and second (or upper and lower) homogeneous portions of the thermal interface and the one or more homogeneous portions of the thermal interface material are integrally connected with each other, and such that the thermally-conductive heat path is continuous along the same thermal interface material.

The thermal interface material may comprise a dispensable thermal interface material, an extrudable thermal interface material, an insert moldable thermal interface material, a thermal putty, a thermal gap filler, and/or a cure-in-place thermal interface material.

The portion of the board level shield may comprise a cover of the board level shield having opposite inner and outer sides along which are the respective first and second homogenous portions of the thermal interface material. The one or more openings in the portion of the board level shield may comprise one or more openings that extend through the cover from the inner side to the outer side. The board level shield may be a single piece board level shield including one or more sidewalls that are integrally formed with the cover. Or, the board level shield may be a multi-piece board level shield including one or more sidewalls, and the cover may be removably attachable to the one or more sidewalls.

The one or more openings in the cover may be a single hole in the cover or multiple holes in the cover. The board level shield may be a single piece board level shield including one or more sidewalls that are integrally formed with the cover. Or, the board level shield may be a multi-piece board level shield including one or more sidewalls to which the cover is removably attachable.

The direct thermal connection or interface provided by the one or more homogeneous portions of the thermal interface material within the one or more openings may allow heat transfer from the first or lower homogeneous portion of the thermal interface material along the first or lower side of the portion of the board level shield to the second or upper homogeneous portion of the thermal interface material along the second or upper side of the portion of the board level shield without using an interface provided by the portion of the board level shield thereby allowing for improved heat transfer efficiency.

The method may include installing one or more sidewalls of the board level shield to a substrate generally about a heat source on the substrate. Heat from the heat source may be transferable along the thermally-conductive heat path to a heat removal/dissipation structure. The board level shield may be operable for providing electromagnetic interference (EMI) shielding for the heat source.

The method may also include positioning the first or lower homogeneous portion of the thermal interface material against a heat source and positioning the second or upper homogeneous portion of the thermal interface material against a heat removal/dissipation structure. Heat may be transferable from the heat source to the heat removal/dissipation structure along the thermally-conductive path defined from the first or lower homogeneous portion of the thermal interface material through the one or more homogeneous portions of the thermal interface material to the second or upper homogeneous portion of the thermal interface material without requiring an interface provided by the portion of the board level shield for heat transfer from the first or lower homogeneous portion of the thermal interface material to the second or upper homogeneous portion of the thermal interface material. The board level shield may be operable for providing electromagnetic interference (EMI) shielding for the heat source.

In another exemplary embodiment, a board level shield comprises a portion having a first or lower side, an second or upper side, and one or more openings that extend through the portion from the first side to the second side. A first or lower portion of a thermal interface material is along the first side of the portion of the board level shield. One or more portions of the same thermal interface material is within the one or more openings. A second or upper portion of the same thermal interface material is along the second side of the portion of the board level shield. A thermally-conductive heat path is cooperatively defined by the first portion of the thermal interface material along the first side of the portion of the board level shield, the one or more portions of the same thermal interface material within the one or more openings, and the second portion of the same thermal interface material along the second side of the portion of the board level shield. The one or more portions of the same thermal interface material within the one or more openings may be contiguous with and provide a direct thermal connection or interface between the first portion of the thermal interface material and the second portion of the same thermal interface material. The first portion of the thermal interface material along the first side of the portion of the board level shield, the one or more portions of the same thermal interface material within the one or more openings, and the second portion of the same thermal interface material along the second side of the portion of the board level shield may be integrally connected with each other. The thermally-conductive heat path may be continuous along the same thermal interface material.

The thermal interface material may comprise a dispensable thermal interface material, an extruded thermal interface material, an insert molded thermal interface material, a thermal putty, a thermal gap filler, and/or a cure-in-place thermal interface material.

The portion of the board level shield may comprise a cover of the board level shield having opposite inner and outer sides along which are the respective first and second portions of the thermal interface material. The one or more openings that extend through the portion from the first side to the second side may comprise one or more openings that extend through the cover from the inner side to the outer side. The one or more openings in the cover may be a single hole in the cover or multiple holes in the cover. The board level shield may be a single piece board level shield including one or more sidewalls that are integrally formed with the cover. Or, the board level shield may be a multi-piece board level shield including one or more sidewalls, and the cover is removably attachable to the one or more sidewalls.

The one or more portions of the same thermal interface material within the one or more openings may provide a direct thermal connection or interface between the first portion of the thermal interface material and the second portion of the same thermal interface material that allows heat transfer from the first portion of the thermal interface material to the second portion of the same thermal interface material without using an interface provided by the portion of the board level shield thereby allowing for improved heat transfer efficiency.

The first portion of the thermal interface material, the one or more portions of the same thermal interface material within the one or more openings, and the second portion of the same thermal interface material may be homogeneous portions integrally formed from the same thermal interface material.

An assembly may comprise a heat removal/dissipation structure, a printed circuit board having a heat source, and the board level shield. The board level shield may be positioned to be operable for providing electromagnetic interference (EMI) shielding for the heat source. Heat may be transferable from the heat source to the heat removal/dissipation structure along the thermally-conductive path defined from the first portion of the thermal interface material through the one or more portions of the same thermal interface material to the second portion of the same thermal interface material.

The heat removal/dissipation structure may be a heat sink. The heat source may be an integrated circuit on a printed circuit board. The first portion of the thermal interface material may be positioned against or in thermal contact with the integrated circuit. The second portion of the same thermal interface material may be positioned against or in thermal contact with the heat sink. Heat may be transferable from the integrated circuit to the heat sink along the thermally-conductive path defined from the first portion of the thermal interface material through the one or more portions of the same thermal interface material to the second portion of the same thermal interface material without requiring an interface provided by the cover for heat transfer from the first portion of the thermal interface material to the second portion of the same thermal interface material. The assembly may be part of an electronic device.

In another exemplary embodiment, a method comprises positioning a board level shield relative to a heat source such that the board level shield is operable for providing electromagnetic interference (EMI) shielding for the heat source, and such that heat is transferable from the heat source along a thermally-conductive heat path cooperatively defined by a first or lower portion of a thermal interface material along a first or lower side of a portion of the board level shield, one or more portions of the same thermal interface material within one or more openings in the portion of the board level shield, and a second or upper portion of the same thermal interface material along a second or upper side of the portion of the board level shield. The first portion of the thermal interface material along the first side of the portion of the board level shield, the one or more portions of the same thermal interface material within the one or more openings in the portion of the board level shield, and the second portion of the same thermal interface material along the second side of the portion of the board level shield may be integrally connected with each other. The thermally-conductive heat path may be continuous along that same thermal interface material.

The method may include positioning the board level shield relative to a heat removal/dissipation structure such that heat is transferable from the heat source to the heat removal/dissipation structure along the thermally-conductive heat path.

The thermal interface material may comprise a dispensable thermal interface material, an extrudable thermal interface material, an insert moldable thermal interface material, a thermal putty, a thermal gap filler, and/or a cure-in-place thermal interface material.

The portion of the board level shield may comprise a cover of the board level shield having opposite inner and outer sides along which are the respective first and second portions of the thermal interface material. The one or more openings that extend through the portion from the first side to the second side may comprise one or more openings that extend through the cover from the inner side to the outer side. The one or more openings in the cover may be a single hole in the cover or multiple holes in the cover. The board level shield may be a single piece board level shield including one or more sidewalls that are integrally formed with the cover. Or, the board level shield may be a multi-piece board level shield including one or more sidewalls, and the cover is removably attachable to the one or more sidewalls.

The direct thermal connection or interface provided by the one or more portions of the thermal interface material within the one or more openings may allow heat transfer from the first portion of the thermal interface material along the first side of the portion of the board level shield to the second portion of the same thermal interface material along the second side of the cover without using an interface provided by the portion of the board level shield thereby allowing for improved heat transfer efficiency.

The first portion of the thermal interface material may be positioned against the heat source. The second portion of the same thermal interface material may be positioned against a heat removal/dissipation structure. Heat may be transferable from the heat source to the heat removal/dissipation structure along the thermally-conductive path defined from the first portion of the thermal interface material through the one or more portions of the same thermal interface material to the second portion of the same thermal interface material without requiring an interface provided by the portion of the board level shield for heat transfer from the first portion of the thermal interface material to the second portion of the same thermal interface material.

In another exemplary embodiment, a method generally includes dispensing a thermal interface material through at least one opening in a portion of a board level shield installed to a substrate into an interior space defined generally between the substrate and the board level shield. Dispensing the thermal interface material may include dispensing first and second homogeneous portions of the thermal interface material along opposing first and second sides of the portion of the board level shield and one or more homogeneous portions of the thermal interface material within one or more openings in the portion of the board level shield that extend through the portion of the board level shield from the first side to the second side.

The method may include dispensing the thermal interface material through the at least one opening via a nozzle to thereby at least partially fill the interior space with the dispensed thermal interface material. The method may further include positioning a nozzle relative to (e.g., in alignment with, at least partially into, etc.) the at least one opening in the board level shield. For example, the nozzle may be aligned with and/or inserted at least partially into the at least one opening.

The method may include installing the board level shield to the substrate. After installing the board level shield to the substrate, dispensing the thermal interface material through the at least one opening into the interior space defined generally between the substrate and the board level shield.

The method may include continuing to dispense the thermal interface material through the at least one opening until the interior space is entirely filled with the dispensed thermal interface material.

Example thermal interface materials that may be used in exemplary embodiments include extrudable thermal interface materials, insert moldable thermal interface materials, dispensable thermal interface materials, thermal putties, thermal gap fillers, thermal phase change materials, thermally-conductive EMI absorbers or hybrid thermal/EMI absorbers, thermal pads, thermal greases, thermal pastes, etc.

Example embodiments may include one or more thermal interface materials of Laird, such as any one or more of the Tputty™ series thermal gap fillers (e.g., Tputty™ 403, 504, 506, 508, or 607 dispensable thermal interface materials, etc.), Tflex™ series gap fillers (e.g., Tflex™ 300 series thermal gap filler materials, Tflex™ 600 series thermal gap filler materials, Tflex™ 700 series thermal gap filler materials, etc.), Tflex™ CR200 two-part cure in place gap filler, Tpcm™ series thermal phase change materials (e.g., Tpcm™ 780 series phase change materials, etc.), IceKap™ series thermal interface materials, and/or CoolZorb™ series thermally conductive microwave absorber materials (e.g., CoolZorb™ 400 series thermally conductive microwave absorber materials, CoolZorb™ 500 series thermally conductive microwave absorber materials, CoolZorb™ 600 series thermally conductive microwave absorber materials, etc.), Tgrease™ 300X silicone-based thermal grease, Tgrease™ 2500 silicone-free thermal grease, Tgon™ encapsulate or potting compounds such as Tgon™ 455-18SH, etc.

In some exemplary embodiments, a dispensable thermal interface material may be dispensed along the upper and lower sides of a BLS cover and may extrude, infiltrate, or infuse within the holes, openings, apertures, etc. in the BLS cover. By way of example, a dispensable thermal interface material of Laird may be used, such as one or more of Tflex™ CR200, Tputty™ 403, Tputty™ 504, and/or Tputty™ 506 dispensable thermal gap fillers. For example, the thermal interface material may comprise a two-part cure in place ceramic filled silicone-based thermal gap filler that is curable at room temperature, has a low viscosity (e.g., 260,000 cps before mixing, etc.), good thermal conductivity (e.g., about 2 W/mk, etc.), and that is soft and compliant (e.g., hardness (Shore 00) 3 second of 45, etc.). As another example, the thermal interface material may comprise a single-part silicone-based thermal gap filler that is soft, compliant, and low abrasion and that has good thermal conductivity (e.g., about 2.3 W/mk, etc.). As a further example, the thermal interface material may comprise a soft silicone-based thermal gap filler that is a ceramic-filled dispensable silicone gel, that is soft and compliant, that has good thermal conductivity (e.g., about 1.8 W/mk, etc.), that can be can be applied like grease, and that is easily dispensable from equipment such as screen print, syringe, and automated equipment. As yet a further example, the thermal interface material may comprise a soft single-part silicone putty thermal gap filler in which no cure is required, that has good thermal conductivity (e.g., about 3.5 W/mk, etc.), and that is soft, compliant, non-abrasive, and dispensable.

In some exemplary embodiments, the thermal interface material may comprise a compliant gap filler having high thermal conductivity and/or may comprise a thermal interface material of Laird, such as one or more of Tflex™ 200, Tflex™ HR200, Tflex™ 300, Tflex™ 300TG, Tflex™ HR400, Tflex™ 500, Tflex™ 600, Tflex™ HR600, Tflex™ SF600, Tflex™ 700, Tflex™ SF800 thermal gap fillers. For example, the thermal interface material may comprise a filled (e.g., alumina, ceramic, boron nitride, etc.) silicone elastomer gap filler that is soft, compliant, free-standing, and/or naturally tacky for adhesion during assembly and transport, and has good thermal conductivity (e.g., about 1.1 W/mk, 1.2 W/mK, 1.6 W/mk, 2.8, W/mK, 3 W/mK, 5 W/mK, etc.). As another example, the thermal interface material may comprise a filled silicone elastomer gel that has good thermal conductivity (e.g., about 1.2 W/mK, 1.8 W/mk, etc.) and that may also include a silicone liner or other dielectric barrier. As a further example, the thermal interface material may comprise a ceramic-filled silicone-free gap filler that has good thermal conductivity (e.g., about 7.8 W/mk, etc.) and a flammability rating of UL94 V0 and/or is naturally tacky.

The cover or lid and the frame, fence, or sidewalls of the BLS may be made from a wide range of materials in exemplary embodiments. By way of example, a non-exhaustive list of exemplary materials from which the BLS or portion thereof may be made include cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, a plastic material coated with electrically-conductive material, or any other suitable electrically-conductive and/or magnetic materials. The materials disclosed in this application are provided herein for purposes of illustration only as different materials may be used depending, for example, on the particular application.

In exemplary embodiments, a thermal interface material may be extruded, insert molded, or otherwise applied to a cover or lid a board level shield (BLS). The BLS cover may be integral with or removably attachable to sidewalls of the BLS. For example, the BLS may include sidewalls that are integrally formed with the upper surface, cover, lid, or top of the BLS. In this example, the sidewalls and upper surface may be formed by stamping the same electrically-conductive piece of material and then folding the stamped material such that the sidewalls are generally perpendicular to the upper surface. Alternatively, the sidewalls may be made separately and not integrally formed with the upper surface of the BLS. In some exemplary embodiments, the BLS may comprise a two-piece shield in which the upper surface, cover, lid, or top is removable from and reattachable to the sidewalls. In some exemplary embodiments, the BLS may include one or more interior walls, dividers, or partitions that are attached to and/or integrally formed with the BLS. In such exemplary embodiments, the BLS cover, sidewalls, and interior walls may cooperatively define a plurality of individual EMI shielding compartments. The BLS frame may include a perimeter flange extending inwardly from the top of the sidewalls in some exemplary embodiments. Alternatively, the frame may be flangeless (without an inwardly extending flange) in other exemplary embodiments. Accordingly, aspects of the present disclosure should not be limited to any particular board level shield configuration.

Example embodiments disclosed herein may be used with a wide range of heat sources, electronic devices, and/or heat removal/dissipation structures or components (e.g., a heat spreader, a heat sink, a heat pipe, a device exterior case or housing, etc.). For example, a heat source may comprise one or more heat generating components or devices (e.g., a CPU, die within underfill, semiconductor device, flip chip device, graphics processing unit (GPU), digital signal processor (DSP), multiprocessor system, integrated circuit, multi-core processor, etc.). Generally, a heat source may comprise any component or device that has a higher temperature than the thermal interface material or otherwise provides or transfers heat to the thermal interface material regardless of whether the heat is generated by the heat source or merely transferred through or via the heat source. Accordingly, aspects of the present disclosure should not be limited to any particular use with any single type of heat source, electronic device, heat removal/dissipation structure, etc.

Exemplary embodiments may provide one or more (but not necessarily any or all) of the following features or advantages, such as improving overall thermal efficiency without compromising on EMI shielding and simplifying assembly without requiring changes to an existing BLS as existing holes in the cover or lid of the existing BLS may be used.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method comprising applying a thermal interface material to a board level shield, such that:
   first and second homogeneous portions of the thermal interface material are respectively along and in direct contact with opposing first and second sides of a portion of the board level shield that is directly between the first and second homogeneous portions of the thermal interface material such that the first and second homogeneous portions of the thermal interface material are spaced apart and separated from each other by the portion of the board level shield intervening therebetween; and
   one or more homogeneous portions of the thermal interface material are within one or more openings in the portion of the board level shield that extend through the portion of the board level shield from the first side to the second side;

whereby the one or more homogeneous portions of the thermal interface material within the one or more openings are contiguous with and provide a direct thermal connection or interface between the first and second homogeneous portions of the thermal interface material that are spaced apart and separated from each other by the portion of the board level shield intervening therebetween, such that a thermally-conductive heat path is cooperatively and integrally defined by the first homogeneous portion of the thermal interface material along the first side of the portion of the board level shield, the one or more homogeneous portions of the thermal interface material within the one or more openings, and the second homogeneous portion of the thermal interface material along the second side of the portion of the board level shield;

wherein applying the thermal interface material to the board level shield comprises an insert molding process that includes:

positioning the portion of the board level shield within a cavity of a mold;

dispensing the thermal interface material into the cavity such that the thermal interface material dispensed into the cavity forms the first and second homogeneous portions of the thermal interface material along the respective first and second sides of the portion of the board level shield and the one or more homogeneous portions of the thermal interface material within the one or more openings; and removing the portion of the board level shield including the thermal interface material dispensed thereon from the cavity of the mold;

wherein:

the cavity is defined by first and second dies or mold portions, and dispensing the thermal interface material into the cavity comprises dispensing the thermal interface material into the cavity through at least one inlet defined by the first die or mold portion and/or the second die or mold portion; and the method further includes after removing the portion of the board level shield including the thermal interface material dispensed thereon from the cavity of the mold, installing the board level shield to a substrate generally about a heat source on the substrate, such that the first homogenous portion of the thermal interface material along the first side of the portion of the board level shield is against the heat source.

2. The method of claim 1, wherein applying the thermal interface material to the board level shield comprises dispensing the thermal interface material through at least one opening of the one or more openings in the portion of the board level shield into an interior space defined by the board level shield.

3. The method of claim 2, wherein:

the one or more openings comprise a plurality of openings; and the method includes dispensing the thermal interface material through the at least one opening to thereby at least partially fill the interior space with the dispensed thermal interface material, whereby the dispensed thermal interface material is disposed within and/or covers at least some of the plurality of openings.

4. The method of claim 1, wherein the dispensed thermal interface material is disposed within and/or covers at least some of the plurality of openings.

5. The method of claim 1, wherein the one or more openings comprise a plurality of openings; and the dispensed thermal interface material is disposed within and/or covers all of the plurality of openings.

6. The method of claim 1, wherein applying the thermal interface material to the board level shield comprises integrally forming all of the first and second homogeneous portions of the thermal interface and the one or more homogeneous portions of the thermal interface material within the one or more openings from the same thermal interface material such that:

the first and second homogeneous portions of the thermal interface and the one or more homogeneous portions of the thermal interface material are integrally connected with each other; and the thermally-conductive heat path is continuous along the same thermal interface material; and the first and second homogeneous portions of the thermal interface material are respective first and second layers of the same thermal interface material respectively along and in direct contact with the opposing first and second sides of the portion of the board level shield.

7. The method of claim 1, wherein the portion of the board level shield comprises a cover of the board level shield having opposite inner and outer sides along which are the respective first and second homogeneous portions of the thermal interface material such that the cover is directly between the first and second homogeneous portions of the thermal interface material and such that the first and second homogeneous portions of the thermal interface material are spaced apart and separated from each other by the cover intervening therebetween, and wherein:

the one or more openings in the portion of the board level shield is a single hole or more than two holes extending through the cover from the inner side to the outer side, and/or the board level shield is a multi-piece board level shield including one or more sidewalls, and the cover is removably attachable to the one or more sidewalls.

8. The method of claim 1, wherein:

the portion of the board level shield comprises a cover of the board level shield having opposite inner and outer sides;

the first and second homogeneous portions of the thermal interface material respectively comprise first and second layers of the thermal interface material along and in direct contact with the respective opposite inner and outer sides of the cover such that the cover is directly between the first and second layers of the thermal interface material and such that the first and second layers of the thermal interface material are spaced apart and separated from each other by the cover intervening therebetween;

the thermal interface material comprises a dispensable thermal interface material, an extrudable thermal interface material, a thermal putty, a thermal gap filler, and/or a cure-in-place thermal interface material, and wherein the method further comprises:

installing one or more sidewalls of the board level shield to a substrate generally about a heat source on the substrate;

positioning the first layer of the thermal interface material along the inner side of the cover against the heat source; and positioning the second layer of the thermal interface material along the outer side of the cover against a heat removal/dissipation structure;

whereby heat is transferrable from the heat source to the heat removal/dissipation structure along the thermally-conductive path defined from the first layer of the thermal interface material through the one or more homogeneous portions of the thermal interface material to the second layer of the thermal interface material without requiring an interface provided by the cover of the board level shield, that is between the first and second homogeneous portions of the thermal interface material, for heat transfer from the first layer of the thermal interface material to the second layer of the thermal interface material; and whereby the board level shield is operable for providing electromagnetic interference (EMI) shielding.

9. The method of claim 1, wherein:

the portion of the board level shield comprises a cover of the board level shield having a surface area;

the one or more openings comprises a plurality of openings in the cover; and the one or more homogenous portions of the thermal interface material within the one or more openings comprise a plurality of homogenous portions of the thermal interface material within the plurality of openings that define at least about 10% or more of the surface area of the cover.

10. The method of claim 9, wherein the plurality of homogenous portions of the thermal interface material within the plurality of openings define at least about 22% of the surface area of the cover.

* * * * *